US009537328B2

(12) United States Patent
Kim

(10) Patent No.: US 9,537,328 B2
(45) Date of Patent: Jan. 3, 2017

(54) BATTERY MANAGEMENT SYSTEM AND METHOD OF DRIVING THE SAME

(71) Applicant: SAMSUNG SDI CO., LTD., Yongin-si, Gyeonggi-do (KR)

(72) Inventor: Seong-Joong Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 167 days.

(21) Appl. No.: 14/228,186

(22) Filed: Mar. 27, 2014

(65) Prior Publication Data

US 2014/0347013 A1 Nov. 27, 2014

Related U.S. Application Data

(60) Provisional application No. 61/826,939, filed on May 23, 2013.

(51) Int. Cl.
*H02J 7/00* (2006.01)
*G01R 31/36* (2006.01)

(52) U.S. Cl.
CPC ......... *H02J 7/0014* (2013.01); *G01R 31/3606* (2013.01); *H02J 7/0016* (2013.01); *H02J 7/0022* (2013.01); *G01R 31/3624* (2013.01); *G01R 31/3658* (2013.01)

(58) Field of Classification Search
CPC .................................................... H02J 7/0031
USPC ......................................................... 320/134
See application file for complete search history.

(56) References Cited

U.S. PATENT DOCUMENTS

| 2009/0090793 | A1* | 4/2009 | Ichige ................. | B05B 1/185 239/428.5 |
| 2009/0146610 | A1* | 6/2009 | Trigiani .............. | H02J 7/0018 320/119 |
| 2010/0213891 | A1* | 8/2010 | Nishikawa .......... | H01M 10/42 320/106 |
| 2011/0080138 | A1* | 4/2011 | Nakanishi ........... | H02J 7/0016 320/116 |
| 2011/0210701 | A1 | 9/2011 | Nakamura | |
| 2011/0304299 | A1 | 12/2011 | Yang et al. | |

(Continued)

FOREIGN PATENT DOCUMENTS

| EP | 2 566 007 A2 | 3/2013 |
| JP | 2010-098782 A | 4/2010 |

(Continued)

OTHER PUBLICATIONS

EPO Office action dated Dec. 15, 2014, for corresponding European Patent application 14162756.2, (6 pages).

*Primary Examiner* — Suresh Memula
(74) *Attorney, Agent, or Firm* — Lewis Roca Rothgerber Christie LLP

(57) ABSTRACT

A battery rack includes: a plurality of battery packs; a plurality of slave battery management systems, each of the slave battery management systems being coupled to a corresponding one of the battery packs, being powered by an operating power, and being configured to use the corresponding one of the battery packs for the operating power in response to receiving a corresponding one of a plurality of operating power changing signals; and a master battery management system coupled to the slave battery management systems and configured to transmit the operating power changing signals to the slave battery management systems.

9 Claims, 5 Drawing Sheets

(56) References Cited

U.S. PATENT DOCUMENTS

| | | | | |
|---|---|---|---|---|
| 2012/0268069 A1* | 10/2012 | Park | ............ | H01M 10/4207 320/116 |
| 2013/0271072 A1* | 10/2013 | Lee | ............ | H01M 10/4207 320/108 |
| 2015/0188334 A1* | 7/2015 | Dao | ............ | H02J 7/0013 320/107 |

FOREIGN PATENT DOCUMENTS

| | | |
|---|---|---|
| JP | 2011-200095 A | 10/2011 |
| KR | 10-2013-0015353 A | 2/2013 |

\* cited by examiner

BATTERY MANAGEMENT SYSTEM AND METHOD OF DRIVING THE SAME

CROSS-REFERENCE TO RELATED APPLICATION

This application claims priority to and the benefit of U.S. Provisional Application No. 61/826,939, filed on May 23, 2013 in the U.S. Patent and Trademark Office, the entire content of which is incorporated herein by reference.

BACKGROUND

1. Field

Embodiments of the present invention relate to a battery management system and a method of driving the same.

2. Description of the Related Art

As environmental destruction and resource depletion become more significant, an interest in a system for storing power and efficiently using the stored power has increased.

A power storage system may store generated power of new and renewable energy in a battery or may store power of a commercial system in a battery with relation to the commercial system. The power storage system may supply power stored in the battery to the commercial system or to a load.

A rechargeable secondary battery may be used for the power storage system in order to store power. However, due to limitations on a capacity of the secondary battery, a number of secondary batteries may be coupled in parallel or may be serially coupled to form a battery pack. There exists a variation in capacities of battery cells that form the battery pack due to various causes in manufacturing processes.

Therefore, in the battery pack, a variation is generated in charge and discharge voltages of the battery cells in a charge and discharge cycle. Therefore, in the battery pack, a specific battery cell may be overcharged during charge and a specific battery cell may be over-discharged during discharge. As described above, when a specific battery cell is overcharged or over-discharged in the battery pack, a capacity of the battery pack is reduced, the battery pack is deteriorated, and a lifespan of the battery pack is reduced.

Therefore, a cell balancing operation that keeps uniformity of voltages of the battery cells may be performed. However, the cell balancing operation is performed based on a voltage of a battery cell having a lowest cell voltage so that energy of battery cells having relatively high voltages may be lost.

Hereinafter, a battery management system for reducing (or preventing) energy from being lost by the cell balancing operation is suggested.

The above information disclosed in this Background section is only for enhancement of understanding of the background of embodiments of the present invention and therefore it may contain information that does not form the prior art that is already known to a person of ordinary skill in the art.

SUMMARY

Embodiments of the present invention provide a battery management system for more efficiently using power stored in a battery pack and a method of driving the same.

In addition, embodiments of the present invention may provide a battery management system for reducing a time for which a cell balancing operation is performed and a method of driving the same.

Aspects of the present invention are not limited to the above, but other aspects that are not described may be clearly understood by those skilled in the art from the following description.

According to one embodiment of the present invention, there is provided a battery rack including: a plurality of battery packs; a plurality of slave battery management systems, each of the slave battery management systems being coupled to a corresponding one of the battery packs, being powered by an operating power, and being configured to use the corresponding one of the battery packs for the operating power in response to receiving a corresponding one of a plurality of operating power changing signals; and a master battery management system coupled to the slave battery management systems and configured to transmit the operating power changing signals to the slave battery management systems.

The slave battery management systems may be configured to measure information related to charging parameters of the battery packs and to transmit the measured information to the master battery management system.

The master battery management system may be configured to selectively transmit the operating power changing signals according to comparison results of states of charge or of voltages of the battery packs.

The master battery management system may be configured to transmit the corresponding one of the operating power changing signals to a slave battery management system of the slave battery management systems coupled to a battery pack of the battery packs having a relatively high state of charge or a relatively high voltage as determined by the comparison results.

The battery pack having the relatively high state of charge or the relatively high voltage may have a state of charge or a voltage higher than a state of charge or a voltage of another battery pack of the plurality of battery packs by more than a threshold state of charge or a threshold voltage.

Each of the slave battery management systems may be configured to selectively change a power source for the operating power between an external power source and the corresponding one of the battery packs in response to receiving the corresponding one of the operating power changing signals.

Each of the slave battery management systems may include a switch unit configured to select one of the external power source or the corresponding one of the battery packs as the power source for the operating power.

The switch unit may include a first relay and a second relay, and the switch unit may be configured to select one of the corresponding one of the battery packs or the external power source using the first relay or the second relay, respectively.

Each of the plurality of slave battery management systems may include a voltage converter coupled between the corresponding one of the battery packs and the second relay, and the voltage converter may be configured to convert a voltage received from the corresponding one of the plurality of battery packs to correspond to the operating power of the slave battery management system.

The corresponding one of the battery packs may include a plurality of battery cells, and each of the slave battery management systems may be configured to receive one of a plurality of cell balancing signals from the master battery management system and to perform a cell balancing operation on the battery cells in response to the cell balancing signal.

According to another embodiment of the present invention, there is provided a method of operating a battery rack comprising: selectively transmitting a plurality of operating power changing signals from a master battery management system; receiving each of the transmitted operating power changing signals at a corresponding one of a plurality of slave battery management systems, each of the slave battery management systems being powered by an operating power source and being coupled to the master battery management system; and using, as the operating power source, a corresponding one of a plurality of battery packs by the corresponding one of the slave battery management systems that receives the transmitted operating power changing signal.

The method of operating the battery rack may further include: measuring battery pack information related to charging parameters of the battery packs by the plurality of slave battery management systems; and transmitting the measured battery pack information to the master battery management system.

The selectively transmitting may occur according to comparison results of states of charge or of voltages of the battery packs.

The selectively transmitting may include transmitting the operating power changing signals to slave battery management systems that are coupled to battery packs having relatively high states of charge or relatively high voltages as determined by the comparison results.

The battery pack having the relatively high state of charge or the relatively high voltage may have a state of charge or a voltage higher than a state of charge or a voltage of another battery pack of the plurality of battery packs by more than a threshold state of charge or a threshold voltage.

The using the corresponding one of the battery packs as the operating power source may include selectively changing the operating power source between an external power source and the corresponding one of the battery packs in response to the corresponding one of the slave battery management systems receiving the transmitted operating power changing signal.

The selectively changing the operating power source may include operating a corresponding switch unit configured to select one of the external power source or the corresponding one of the plurality of battery packs as the operating power source.

The operating the corresponding switch unit may include driving a first relay or a second relay to select the corresponding one of the battery packs or the external power source, respectively.

The method of operating the battery rack may further include converting a voltage received from the external power source or the corresponding one of the battery packs to an operating voltage of the slave battery management systems.

The method of operating the battery rack may further include: selectively sending a plurality of cell balancing signals from the master battery management system; receiving a corresponding one of the sent cell balancing signals at a cell balancing slave battery management system of the plurality of slave battery management systems coupled to a corresponding cell balancing battery pack of the plurality of battery packs; and selectively performing a cell balancing operation on a plurality of battery cells in the cell balancing battery pack in response to receiving the cell balancing signal at the cell balancing slave battery management system.

Aspects of the battery management system according to embodiments of the present invention will be described as follows.

According to at least one example embodiment of the present invention, power stored in a battery pack may be more efficiently used.

In addition, according to at least one example embodiment of the present invention, a time for which a cell balancing operation is performed may be reduced. Aspects of the present invention are not limited to the above, but other aspects that are not described may be clearly understood by those skilled in the art.

DETAILED DESCRIPTION

Figure 1:
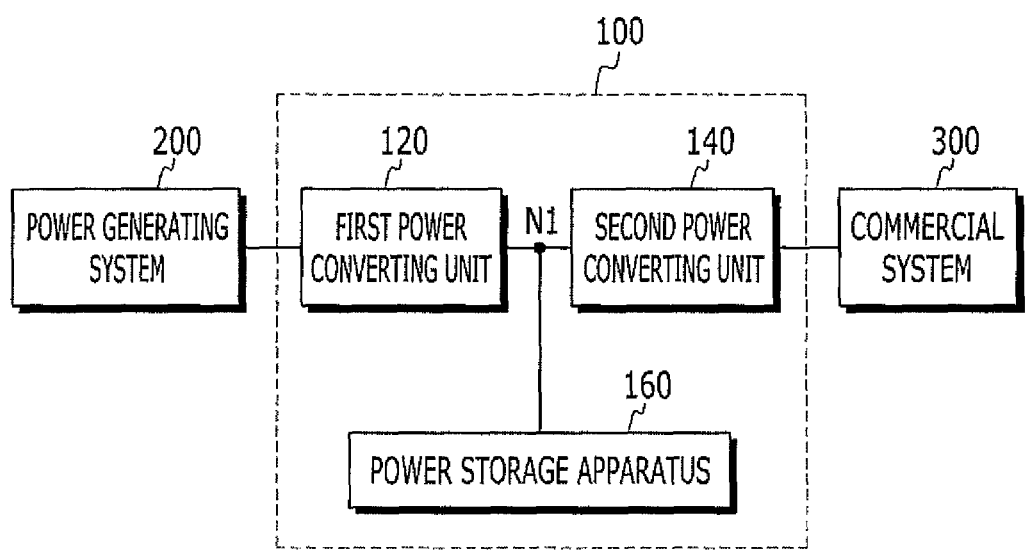
FIG. 1 is a view illustrating a power storage system according to an example embodiment of the present invention.

Embodiments of the present invention are described more fully hereinafter with reference to the accompanying drawings, in which example embodiments of the present invention are shown. This present invention may, however, be embodied in many different forms and should not be construed as limited to the example embodiments set forth herein. Rather, these example embodiments are provided so that this disclosure is thorough, and will fully convey the scope of embodiments of the present invention to those skilled in the art. In the drawings, the size and relative sizes of elements may be exaggerated for clarity. Like reference numerals in the drawings denote like elements.

Hereinafter, a power storage system according to an example embodiment of the present invention and a method of driving the same will be described in detail.

FIG. 1 is a view illustrating a power storage system according to an example embodiment of the present invention.

A power storage system 100 according to an example embodiment of the present invention is coupled between a power generating system 200 and a commercial system 300.

The power generating system 200 may include a system for generating electrical energy using new and renewable energy such as solar light, wind power, wave power, tidal power, geothermal heat, and/or the like. The power generating system 200 may include a commercial system as well as the new and renewable energy.

The commercial system 300 may include a power station for generating power through firepower, waterpower, and/or nuclear power generation and may include a substation and a transmission site for changing a property of a voltage or a current in order to transmit generated power through a power transmission line or a power distribution line.

In FIG. 1, the power storage system 100 is coupled to the commercial system 300. However, the commercial system 300 may be replaced by a load. The load refers to various electrical devices that use power (e.g., home appliances or producing facilities of a factory).

As illustrated in FIG. 1, the power storage system 100 according to the example embodiment of the present invention includes a first power converting unit (or a first power converter) 120, a second power converting unit (or a second power converter) 140, and a power storage apparatus 160.

The first power converting unit 120 is coupled to the power generating system 200 to convert first power generated by the power generating system 200 into second power and to transmit the second power to a node N1. The first power generated by the power generating system 200 may be direct current (DC) power or alternate current (AC) power, and power of the node N1 is DC power. That is, the first power converting unit 120 may be a DC-DC converter for converting first DC power into DC power or an AC-DC converter for converting first AC power into DC power.

The second power converting unit 140 is coupled between the node N1 and the commercial system 300. The second power converting unit 140 converts the DC power of the node N1 into AC power to transmit the AC power to the commercial system 300. That is, the second power converting unit 140 may be a DC-AC converter for converting DC power into AC power.

The power storage apparatus 160 stores the DC power of the node N1. The power storage apparatus 160 may supply the stored DC power to the node N1 again during power failure. During power failure, the DC power supplied from the power storage apparatus 160 to the node N1 is converted by the second power converting unit 140 to be transmitted to the commercial system 300 or to a load. Therefore, even during power failure, stable power may be supplied (e.g., always supplied) to the commercial system 300 or to the load.

The power storage apparatus 160 may not only supply the DC power to the node N1 during power failure, but may always supply the stored power to the node N1. In this case, the power supplied from the power generating system 200 may be transmitted (e.g., always transmitted) to the commercial system 300 or the load through the power storage apparatus 160.

Figure 2:
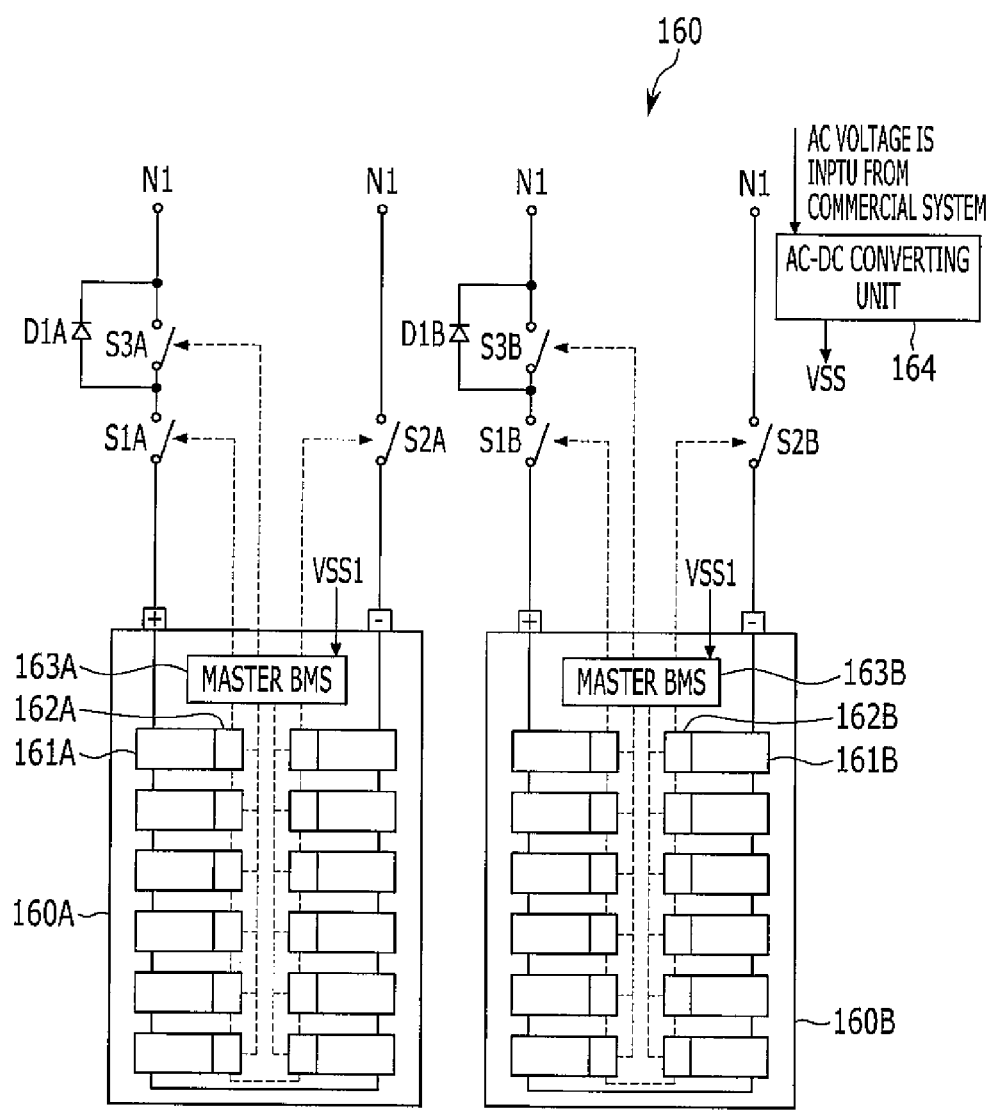
FIG. 2 is a view illustrating an internal structure of a power storage apparatus according to an example embodiment of the present invention.

Referring to FIG. 2, the power storage apparatus 160 according to an example embodiment of the present invention will be described in detail.

FIG. 2 is a view illustrating an internal structure of the power storage apparatus 160 according to the example embodiment of the present invention.

As illustrated in FIG. 2, the power storage apparatus 160 according to the example embodiment of the present invention includes a plurality of battery racks 160A and 160B, an AC-DC converting unit (or AC-DC converter) 164, a plurality of main switches S1A, S1B, S2A, and S2B, a plurality of charge switches S3A and S3B, and diodes D1A and D1B. In FIG. 2, flow paths of voltage and current are illustrated by solid lines and flows of a measuring signal and a switching control signal of a battery management system are illustrated by dotted lines.

The first battery rack 160A includes a plurality of battery packs 161A, a plurality of slave battery management systems 162A (hereinafter, referred to as 'slave BMS'), and a master battery management system 163A (hereinafter, referred to as 'master BMS').

The plurality of battery packs 161A are serially coupled to each other to be coupled to a positive potential output end (+) and a negative potential output end (−) of the battery rack 160A. Power lines are coupled to the positive potential output end (+) and the negative potential output end (−) of the battery rack 160A, respectively. That is, the plurality of serially coupled battery packs 161A output power to the power lines through the positive potential output end (+) and the negative potential output end (−) of the battery rack 160A.

The battery packs 161A include a plurality of cells serially coupled to each other or coupled to each other in parallel. Here, a cell as a rechargeable secondary battery may include a nickel-cadmium battery, a lead battery, a nickel metal hydride battery, a lithium ion battery, and/or a lithium polymer battery.

The plurality of slave BMSs 162A manage charge and discharge of the battery packs 161A, respectively, and the master BMS 163A manages charge and discharge of the battery rack 160A. In FIG. 2, the slave BMSs 162A are provided in the battery packs 161A, respectively. However, the slave BMSs 162A may be provided to manage charge and discharge of the plurality of battery packs 161A.

The slave BMSs 162A may measure states of the plurality of battery packs 161A. The slave BMSs 162A may measure voltages, currents, or temperatures of the cells included in the battery packs 161A, respectively. The slave BMSs 162A may transmit information (hereinafter, referred to as battery state information) on measured states of the battery packs 161A to the master BMS 163A.

The master BMS 163A may estimate states of charge (SOC) and states of health (SOH) of the respective cells or battery packs through the battery state information received from the respective slave BMSs 162A. Thus, the master BMS 163A may control charge and discharge of the battery rack 160A.

In addition, the master BMS 163A may control the cells included in the battery packs 161A to perform cell balancing operations using the battery state information.

To be specific, the master BMS 163A may output a cell balancing signal to the respective slave BMSs 162A. Then, the slave BMSs 162A may perform cell balancing operations using a passive cell balancing method of emitting power of cells having relatively high states of charge (SOC) through balancing resistance (i.e., resistance). The slave BMSs may also perform cell balancing operations using an active cell balancing method of supplying power of cells having relatively high SOC to cells in relatively low SOC.

Furthermore, the master BMS 163A may detect whether or not there is something wrong with voltages and currents of the respective battery packs 161A or the battery rack 160A through the battery state information transmitted from the respective slave BMSs 162A. The master BMS 163A transmits a switching control signal to the main switches S1A and S2A so that the main switches S1A and S2A are blocked (e.g., open) when it is determined that there is something wrong with the respective battery packs 161A or the battery rack 160A to protect a battery.

Then, the master BMS 163A generates a switching control signal for controlling turn-on/turn-off of the charge switch S3A to transmit the switching control signal to the charge switch S3A. The master BMS 163A according to the example embodiment of the present invention turns on the charge and discharge switch S3A when the battery rack 160A is to be charged and turns off the charge and discharge switch S3A when a charge operation is completed.

Furthermore, when there is something wrong with the master BMS 163A, one of the plurality of slave BMSs 162A may function as the master BMS 163A. The slave BMS 162A that functions as the master BMS 163A may detect whether there is something wrong with the voltage and current of the battery rack 160A to control the main switches S1A and S2A.

The second battery rack 160B includes a plurality of battery packs 161B, a plurality of slave BMSs 162B, and a master BMS 163B like the first battery rack 160A. Since an internal structure of the second battery rack 160B and functions of the respective elements of the second battery rack 160B are the same or substantially the same as those of the first battery rack 160A, detailed description thereof may be omitted.

The AC-DC converting unit 164 receives an AC voltage from the commercial system and converts the received AC voltage into a DC voltage VSS to transmit the DC voltage VSS to the master BMS 163A and the master BMS 163B. The DC voltage VSS output from the AC-DC converting unit 164 is used as operating power for operating the master BMS 163A and the master BMS 163B. In addition, the DC voltage VSS may be transmitted to the respective slave BMSs 162A and 162B to be used as operating power for operating the respective slave BMSs 162A and 162B.

Furthermore, in relation to the operating power of the slave BMSs 162A, before performing the above-described cell balancing operation or while performing the above-described cell balancing operation, use of the DC voltage VSS as the operating power of the slave BMSs 162A may be stopped and power stored in the battery packs 161A managed by the slave BMSs 162A may be used.

To be specific, the master BMS 163A outputs an operating power changing signal so that the power stored in the respective battery packs 161A is used as operating power of the respective slave BMSs 162A. At this time, power of battery packs 161A having relatively high voltages may be used as the operating power of the slave BMSs so that voltages of the plurality of battery packs managed by the master BMS 163A are uniform. At this time, it is assumed that a voltage of a battery pack is the sum of voltages of battery cells included in the battery pack 161A.

The master BMS 163A may compare voltages or SOC of the plurality of battery packs 161A with each other using the battery state information. The master BMS 163A may generate the operating power changing signal using a comparison result.

The master BMS 163A may output the operating power changing signal to the first slave BMS 162A having a relatively high voltage or SOC (e.g., coupled to a battery pack 161A having a relatively high voltage or SOC) so that the voltages or SOC of the plurality of battery packs 161A are uniform or substantially uniform.

Then, the first slave BMS 162A may stop using the operating power of the DC voltage VSS received from the master BMS 163A and may use power stored in the first battery pack 161A as operating power in accordance with or in response to the operating power changing signal. Hereinafter, operating power changing processes of the above-described slave BMSs will be described by battery pack balancing.

One end of the main switch S1A is coupled to the positive potential output end (+) of the first battery rack 160A. One end of the charge switch S3A may be coupled to the other end of the main switch S1A and the other end of the charge switch S3A may be coupled to the node N1. An anode of a diode D1A may be coupled to one end of the charge switch S3A and a cathode of the diode D1A may be coupled to the other end of the charge switch S3A. The main switch S2A may be coupled between the negative potential output end (−) of the first battery rack 160A and the node N1.

Here, each of the main switches S1A and S2A may be maintained in a turn-on state during charge/discharge to form a charge channel and a discharge channel. The main switches S1A and S2A may be turned off in order to block a voltage and a current output from the positive potential output end (+) and the negative potential output end (−) of the first battery rack 160A when there is something wrong with the first battery rack 160A.

Since the first battery rack 160A to which the plurality of battery packs 161A are serially coupled may output a high voltage and a high current of about 1 kV and 300 A, respectively, the main switches S1A and S2A may be realized by semiconductor devices capable of blocking the high voltage and the high current. Furthermore, since each of the main switches S1A and S2A form the charge channel and the discharge channel, the main switches S1A and S2A may be realized by back-to-back switches whose drains are coupled to each other.

The charge switch S3A is turned on during a charge operation of the first battery rack 160A to form a charge channel and may be turned off when charge is completed. The diode D1A may form a discharge channel during a discharge operation of the first battery rack 160A.

Furthermore, one end of the main switch S1B may be coupled to a positive potential output end (+) of the second battery rack 160B. One end of the charge switch S3B may be coupled to the other end of the main switch S1B and the other end of the charge switch S3B may be coupled to the node N1. An anode of a diode D1B may be coupled to one end of the charge switch S3B and a cathode of the diode D1B may be coupled to the other end of the charge switch S3B. The main switch S2B may be coupled between a negative potential output end (−) of the second battery rack 160B and the node N1.

Here, each of the main switches S1B and S2B may be maintained in a turn-on state during charge/discharge to form a charge channel and a discharge channel. The main switches S1B and S2B may be turned off in order to block a voltage and a current output from the positive potential output end (+) and the negative potential output end (−) of the second battery rack 160B when there is something wrong with the second battery rack 160B.

Since the second battery rack 160B may output a high voltage and a high current, the main switches S1B and S2B may be realized by semiconductor devices capable of blocking the high voltage and the high current. Furthermore, since each of the main switches S1B and S2B must form the charge channel and the discharge channel, the main switches S1B and S2B may be realized by back-to-back switches whose drains are coupled to each other.

The charge switch S3B is turned on during a charge operation of the second battery rack 160B to form a charge channel and may be turned off when charge is completed. The diode D1B may form a discharge channel during a discharge operation of the second battery rack 160B.

Next, referring to FIG. 3, structures of slave BMSs and a master BMS that perform battery pack balancing by changing operation power will be described in detail.

Figure 3:
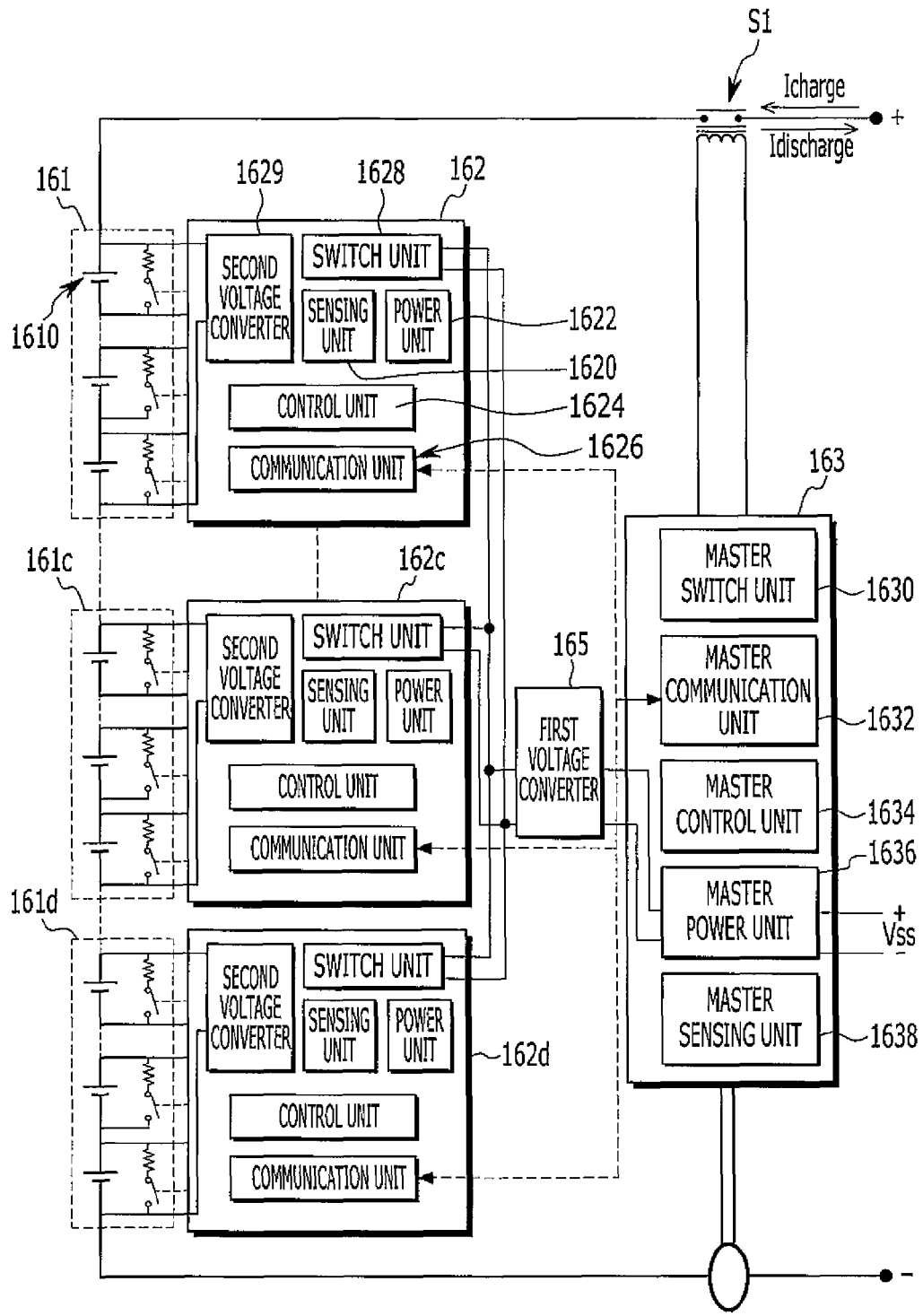
FIG. 3 is a view illustrating a battery management system according to an example embodiment of the present invention.

FIG. 3 is a view illustrating a battery management system according to an example embodiment of the present invention. As illustrated in FIG. 3, a positive potential output end (+) and battery packs 161 are coupled to each other by a power line, and a current (charge that flows through the power line to charge the battery packs 161 or a current Idischarge for discharging power charged in the battery packs 161 to the outside may be blocked in accordance with an operation of a main switch S1.

A master BMS 163 may include a master switch unit (or a master switch) 1630, a master communication unit (or a master communicator) 1632, a master control unit (or a master controller) 1634, a master power unit 1636, and a master sensing unit (or a master sensor) 1638.

First, the master power unit 1636 may receive the DC voltage VSS obtained by converting the AC voltage from the AC-DC converting unit 164 so that the DC voltage VSS may be used as the operating power of the master BMS 163.

The master power unit 1636 may output the DC voltage VSS to a first voltage converter 165. Then, the first voltage converter 165 may convert the DC voltage VSS into a voltage corresponding to operating power of slave BMSs 162 to supply the converted voltage to the respective slave BMSs 162. The respective slave BMSs 162 may use the voltage supplied from the first voltage converter 165 as the operating power.

The master communication unit 1632 may receive battery state information from the slave BMSs 162 to output the received battery state information to the master control unit 1634.

In addition, the master communication unit 1632 may transmit a signal generated by the master control unit 1634 to control the slave BMSs 162 to communication units 1626 of the slave BMSs 162.

The master sensing unit 1638 may measure the current that flows through the power line. For example, the master sensing unit 1638 may directly measure the current that flows through the power line using resistance formed in the power line.

In another example, the master sensing unit 1638 may measure the current that flows through the power line using a hall sensor. Then, the master sensing unit 1638 may output a measured result to the master control unit 1634. Units by which the master sensing unit 1638 measures the current that flows through the power line are not limited to those in the above example.

Next, the master control unit 1634 may estimate SOC and SOH of cells 1610 using the battery state information output from the master communication unit 1632. For example, the master control unit 1634 may include a data table that represents a relationship between open circuit voltages (OCV) and SOC to calculate the SOC of the respective cells 1610 from detected data that represents a relationship between the OCVs and the SOC of the respective cells 1610.

However, a method of calculating the SOC of the battery cells 1610 is not limited to the method of calculating the SOC of the battery cells 1610 from the OCVs. For example, various appropriate or suitable methods of calculating the SOC such as a current integrating method may be used.

The master control unit 1634 may receive the SOC and the SOH of the respective cells 1610 that are calculated by the slave BMSs 162 through the master communication unit 1632.

The master control unit 1634 may generate a signal for changing the operating power of the slave BMSs 162 in which voltages or SOC of the battery packs 161 are relatively high using the battery state information to output the generated signal to the corresponding slave BMSs 162.

That is, the master control unit 1634 may generate the operating power changing signal for performing a battery pack balancing operation to output the generated operating power changing signal to the slave BMSs 162.

For example, the master control unit 1634 may calculate the voltages or SOC of the battery packs 161 including the respective cells 1610 using voltage values of the respective cells 1610. Then, the master control unit 1634 may compare the voltages or SOC of the respective battery packs 161 with each other.

The master control unit 1634 may generate the operating power changing signal so that power charged in the battery packs 161 is used as the operating power of the slave BMSs 162 in which the voltages or SOC of the battery packs 161 are relatively high to output the generated operating power changing signal to the corresponding slave BMSs 162.

For example, the first slave BMS 162 may manage the first battery pack 161, the second slave BMS 162c may manage the second battery pack 161c, the third slave BMS 162d may manage the third battery pack 161d, and the master BMS 163 may manage the first slave BMS 162, the second slave BMS 162c, and the third slave BMS 162d.

The master control unit 1634 may determine that the first battery pack 161 has a higher voltage or SOC than that of the second battery pack 161c and the third battery pack 161d.

The master control unit 1634 may output the operating power changing signal to the first slave BMS 162 so that voltages or SOC of the first battery pack 161, the second battery pack 161c, and the third battery pack 161d are uniform.

To be specific, the master controller 1634 may calculate differences in voltage or charge state between the battery packs 161 and 161c and between the battery packs 161 and 161d. When the calculated voltage differences are no less than (e.g., greater than or equal to) a threshold voltage value or the calculated differences in charge state are no less than (e.g., greater than or equal to) a threshold charge state, the master controller 1634 may output the operating power changing signal to the slave BMS 162 that manages the battery pack 161 that has a higher voltage or is in a higher charge state.

For example, when the difference in charge state between a first battery pack 161 and the second battery pack 161c is no less than (e.g., greater than or equal to) 5%, the master controller 1634 may output the operating power changing signal to the slave BMS (e.g., 162 or 162c) that manages the battery pack 161 that is in a higher charge state between the first battery pack 161 and the second battery pack 161c.

As another example, when the voltage difference between the first battery pack 161 and the third battery pack 161d is no less than (e.g., greater than or equal to) 2V, the master controller 1634 may output the operating power changing signal to the slave BMS 162 that manages the battery pack 161 that has a higher voltage between the first battery pack 161 and the third battery pack 161d.

Alternatively, the master controller 1634 may calculate deviations in voltage or charge state between the battery packs 161 and 161c and between the battery packs 161 and 161d. When the calculated voltage deviations are no less than (e.g., greater than or equal to) a reference value (e.g., a predetermined value) or the calculated deviations in charge state are no less than (e.g., greater than or equal to) a reference value (e.g., a predetermined value), the master controller 1634 may output the operating power changing signal to the slave BMS 162 that manages the battery pack 161 that has a higher voltage or is in a higher charge state.

Then, the slave BMS 162 that receives the operating power changing signal may use the power charged in the battery pack 161 as the operating power of the slave BMS 162. As the power charged in the battery pack 161 is used as the operating power of the slave BMS 162, the voltage of the battery pack 161 or the power charged in the battery pack

161 may be reduced. Therefore, the voltages or SOC of the entire battery packs 161 may be uniform by the battery pack balancing operation.

Then, a variation in the voltages of the entire battery cells included in the entire battery packs or a variation in the SOC of the entire battery cells may be reduced. To be specific, since the power charged in the battery pack 161 managed by the slave BMS 162 that receives the operating power changing signal is used as the operating power of the slave BMS 162, the power charged in the battery cells 1610 included in the corresponding battery pack 161 may be reduced.

Therefore, the voltages or SOC of the battery cells 1610 having relatively high voltages that are included in the corresponding battery pack 161 may be reduced so that a deviation in the voltages or SOC of the entire battery cells 1610 may be reduced.

When the deviation in the voltages or SOC of the entire battery cells 1610 is reduced to be no more than a reference level (e.g., a predetermined level), the master control unit 1634 may output an operating power change stopping signal and may generate a cell balancing signal.

The master control unit 1634 may output the cell balancing signal to the slave BMSs 162 so that a cell balancing operation is performed on the respective cells 1610. Then, the slave BMSs 162 that receive the cell balancing signal may perform a balancing operation on the voltages of the battery cells 1610 included in the battery packs 161.

In addition, after performing balancing, the master control unit 1634 may determine a balancing terminating condition and may output a cell balancing terminating signal to the slave BMSs 162. The master control unit 1634 may determine whether a balanced cell voltage reaches a specific voltage value or a difference between the balanced cell voltage and a minimum cell voltage is no more than the specific voltage value. In addition, the master control unit 1634 may determine whether a cell temperature deviates from a reference range (e.g., a predetermined range).

For example, in a case of balancing during full-charge, the master control unit 1634 may terminate cell balancing when the cell voltage is no more than 3.8V or the difference between the balanced cell voltage and the minimum cell voltage is no more than 5 mV. In a case of balancing during overcharge, the master control unit 1634 may terminate cell balancing when the minimum cell voltage is no more than 2.2V or the difference between the balanced cell voltage and the minimum cell voltage is no more than 5 mV. In addition, the master control unit 1634 may terminate cell balancing when the cell temperature is no more than 0° C. or no less than 50° C.

The master control unit 1634 may generate a signal for controlling the main switch S1 in accordance with the battery state information transmitted from the slave BMSs 162 and the current measuring result of the master sensing unit 1638 to output the generated signal to the master switch unit 1630.

Each of the slave BMSs 162 may include a sensing unit (or sensor) 1620, a power unit 1622, a control unit (or controller) 1624, a communication unit 1626, a switch unit 1628, and a second voltage converter 1629. The second voltage converter 1629 may be provided outside the slave BMS 162.

First, the sensing unit 1620 may measure states of the battery pack 161 and the respective cells 1610 included in the battery pack 161. For example, the sensing unit 1620 may measure an entire voltage or an intermediate voltage (i.e., a total voltage of the entire cells 1610 or voltages of the respective cells 1610) of the battery pack 161, a temperature of the battery pack 161 or of the respective cells 1610, and/or a current that flows through the battery pack 161 or the respective cells 1610.

The voltage values measured by the sensing unit 1620 may include OCVs of the respective cells 1610 or voltages measured during charge and discharge.

The sensing unit 1620 may be coupled to nodes among the respective cells 1610 in order to measure the entire voltage or intermediate voltage of the battery pack 161. That is, at least one wiring line for measuring the intermediate voltage of the battery pack 161 may be formed between the sensing unit 1620 and the cells 1610. The measured voltage values, current values, and temperature values of the respective cells 1610 may be output to the control unit 1624.

The communication unit 1626 and the power unit 1622 may transmit the battery state information to the master BMS 163 by control of (or in accordance with control signals received from) the control unit 1624. The battery state information may include a value measured by the sensing unit 1620.

In addition, the communication unit 1626 and the power unit 1622 may receive the operating power changing signal and the cell balancing signal output from the master BMS 163 to transmit the received operating power changing signal and cell balancing signal to the control unit 1624.

The power unit 1622 may receive power for operating the slave BMS 162 to supply the received power to the respective elements of the slave BMS 162.

The switch unit 1628 may apply the power supplied from the first power changing unit 165 or the power supplied from the battery pack 161 to the power unit 1622. The switch unit 1628 may selectively apply the power supplied from the first power changing unit 165 or the power supplied from the battery pack 161 to the power unit 1622 in accordance with the control of (or in accordance with control signals received from) the control unit 1624.

The second voltage converter 1629 may convert the voltage of the battery pack 161 to supply the converted voltage to the power unit 1622 through the switch unit 1628. For example, the battery pack 161 may be coupled to one end of the second voltage converter 1629 and the switch unit 1628 may be electrically coupled to the other end of the second voltage converter 1629. When the switch unit 1628 performs an operation for using the power stored in the battery pack 161 as the operating power of the slave BMS 162, the second voltage converter 1629 may be electrically coupled to the power unit 1622 to convert the voltage of the battery pack 161 and to supply the converted voltage as the operating power of the slave BMS 162.

The control unit 1624 may estimate the SOC or SOH of the battery pack 161 or the respective cells 1610 included in the battery pack 161 from the voltage values, current values, and temperature values of the respective cells 1610 that are output from the sensing unit 1620.

In addition, the control unit 1624 may generate a signal for controlling an operation of the switch unit 1628 to output the generated signal to the switch unit 1628 in accordance with the operating power changing signal received from the communication unit 1626.

For example, when the operating power changing signal is received, the control unit 1624 may provide a signal for operating the switch unit 1628 to the switch unit 1628 so that the switch unit 1628 and the second voltage converter 1629 are coupled to each other. Then, the voltage of the battery pack 161 may be converted by the second voltage converter 1629 to be supplied to the power unit 1622.

In addition, when the cell balancing signal is received, the control unit 1624 may perform the cell balancing operation. For example, the control unit 1624 may turn on or off a balancing switch for a cell to be balanced among the battery cells 1610 to perform discharge through balancing resistance and to perform the cell balancing operation.

Hereinafter, referring to FIG. 4, the slave BMS 162 whose operating power is converted by driving the switch unit 1628 will be described.

Figure 4:
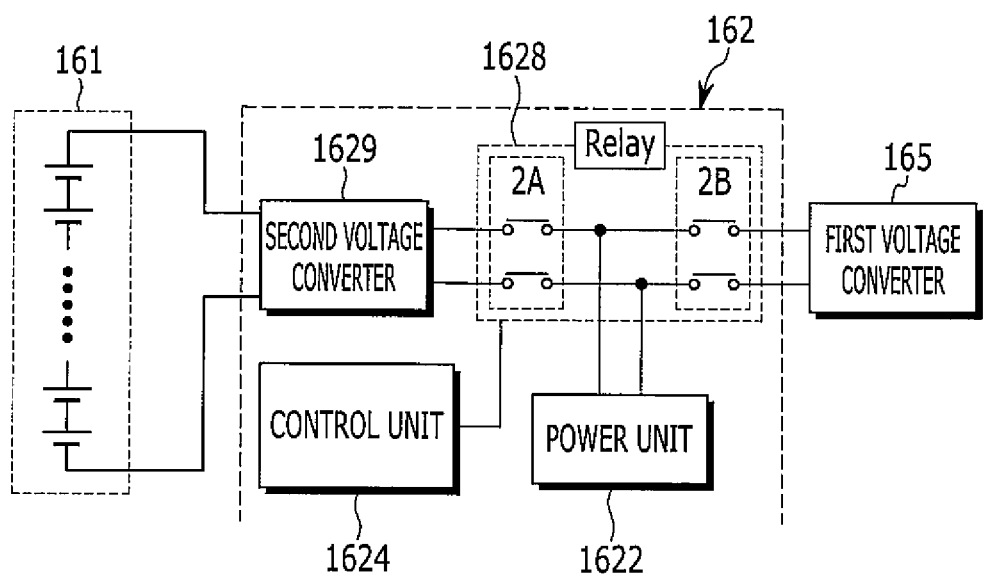
FIG. 4 is a view illustrating a slave battery management system (BMS) to which driving power is applied according to an example embodiment of the present invention.

FIG. 4 is a view illustrating the slave BMS 162 to which the operating power is applied according to an example embodiment of the present invention. As illustrated in FIG. 4, the switch unit 1628 may include relays 2A and 2B and may drive the relays 2A and 2B in accordance with the signal of the control unit 1624. For example, the respective relays may be driven by currents applied from the control unit 1624.

First, the control unit 1624 may drive the relay 2B to supply the power whose voltage is converted by the first voltage converter 165 to the power unit 1622.

When the operating power changing signal is received from the master BMS, the control unit 1624 may output a signal for stopping driving of the relay 2B and driving the relay 2B to the switch unit 1628. Then, the relay 2A of the switch unit 1628 is driven and driving of the relay 2B may be stopped.

The switch unit 1628 may further include a capacitor for preventing coupling of a voltage to be applied to the power unit 1622 when both the relays 2A and 2B are driven or driving of both the relays 2A and 2B is stopped.

When the relay 2B operates, the power charged in the battery pack 161 may be applied to the power unit 1622 through the second voltage converter 1629. The second voltage converter 1629 may convert the voltage of the battery pack 161 into a voltage suitable for a driving voltage of the slave BMS 162.

When the operating power change stopping signal is received from the master BMS, the control unit 1624 may output a signal for stopping driving of the relay 2A and driving the relay 2B to the switch unit 1628. Then, the relay 2B of the switch unit 1628 may be driven and driving of the relay 2A may be stopped. When the relay 2B operates, the power of which voltage is converted by the first voltage converter 165 may be supplied to the power unit 1622.

Hereinafter, referring to FIG. 5, a method of changing the operating power of the slave BMS 162 will be described.

Figure 5:
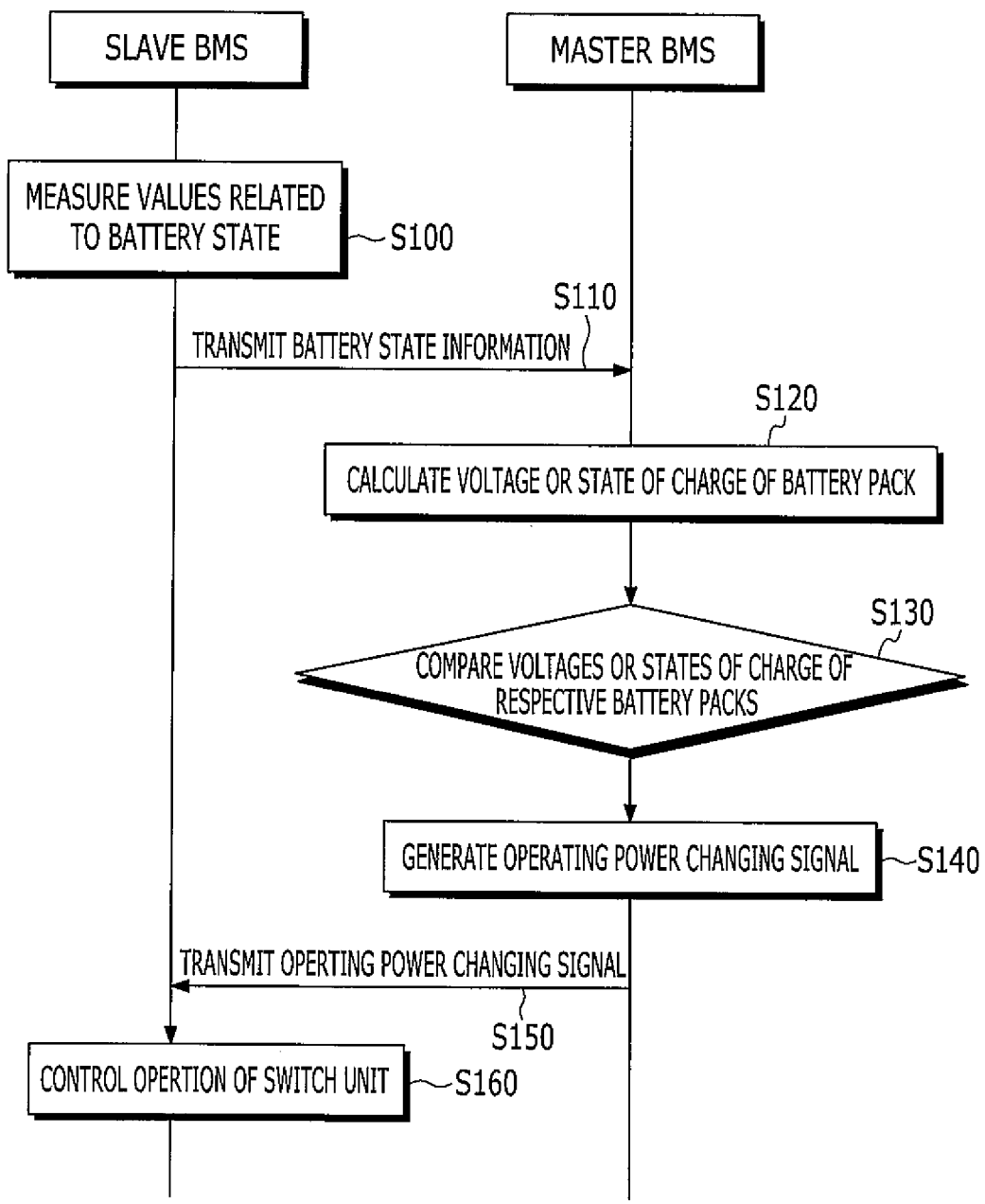
FIG. 5 is a flowchart illustrating a method of driving a battery management system according to an example embodiment of the present invention.

FIG. 5 is a flowchart illustrating a method of driving a battery management system according to an example embodiment of the present invention. As illustrated in FIG. 5, the slave BMS 162 measures values related to the state of the battery pack 161 S100. For example, the sensing unit 1620 of the slave BMS 162 may measure the voltages, currents, or temperatures of the respective battery cells 1610 and the battery pack 161.

Then, the slave BMS 162 transmits state information on the battery pack 161 to the master BMS 163 S110. For example, the communication unit 1626 of the slave BMS 162 may convert the battery state information into a CAN communication type signal to output the CAN communication type signal to the master BMS 163 in accordance with the control of (or in accordance with control signals received from) the control unit 1624.

The slave BMS 162 measuring the battery state information S100 and the slave BMS 162 transmitting the measured battery state information to the master BMS S110 may be periodically performed while the slave BMS 162 operates.

Next, the control unit 1624 of the master BMS 163 calculates the voltage or SOC of the battery pack 161 using the battery state information output from the slave BMS 162 S120.

The master BMS 163 compares the voltages or SOC of the respective battery packs 161 with each other S130. Then, a signal for changing the operating power of the slave BMS 162 of the battery pack 161 having a relatively high SOC or voltage is generated S140.

Then, the master BMS 163 transmits the operating power changing signal to the slave BMS 162 S150.

The slave BMS that receives the operating power changing signal controls the operation of the switch unit so that the operating power is supplied from the battery pack S160. Then, the slave BMS 162 may convert the power stored in the battery pack 161 into the operating power to use the operating power.

While this invention has been described in connection with what is presently considered to be practical example embodiments, it is to be understood that the present invention is not limited to the disclosed embodiments, but, on the contrary, is intended to cover various modifications and equivalent arrangements included within the spirit and scope of the appended claims, and equivalents thereof. Therefore, a person of an ordinary skill in the art may easily make a selection and replacement. In addition, a person of an ordinary skill in the art may omit parts of the constituent elements described in the present specification without deteriorating performance or may add constituent elements in order to improve performance. In addition, a person of an ordinary skill in the art may change an order of the processes of the method described in the present specification in accordance with process environment or equipment. Therefore, scope of the present invention must be determined not by the described example embodiments but by the appended claims and equivalents thereof.

DESCRIPTION OF SYMBOLS

100: power storage system
200: power generating system
300: commercial system
120: first power converting unit
140: second power converting unit
160: power storage apparatus
161: battery pack
162: slave BMS
163: master BMS

What is claimed is:
1. A battery rack comprising:
a plurality of battery packs;
a plurality of slave battery management systems, each of the slave battery management systems comprising a switch unit to selectively deliver an operating power from an external power source, or from a corresponding one of the battery packs coupled to the slave battery management system, in response to receiving a corresponding one of a plurality of operating power changing signals; and
a master battery management system coupled to the slave battery management systems to transmit the operating power changing signals to the slave battery management systems.
2. The battery rack of claim 1, wherein the slave battery management systems are configured to measure information related to charging parameters of the battery packs and to transmit the measured information to the master battery management system.

3. The battery rack of claim 1, wherein the master battery management system is configured to selectively transmit the operating power changing signals according to comparison results of states of charge or of voltages of the battery packs.

4. The battery rack of claim 3, wherein the master battery management system is configured to transmit the corresponding one of the operating power changing signals to a slave battery management system of the slave battery management systems coupled to a battery pack of the battery packs having a relatively high state of charge or a relatively high voltage as determined by the comparison results.

5. The battery rack of claim 4, wherein the battery pack having the relatively high state of charge or the relatively high voltage has a state of charge or a voltage higher than a state of charge or a voltage of another battery pack of the plurality of battery packs by more than a threshold state of charge or a threshold voltage.

6. The battery rack of claim 1, wherein each of the slave battery management systems is configured to selectively change a power source for the operating power between an external power source and the corresponding one of the battery packs in response to receiving the corresponding one of the operating power changing signals by using the switch unit.

7. The battery rack of claim 6,
wherein the switch unit comprises a first relay and a second relay, and
wherein the switch unit is configured to select one of the corresponding one of the battery packs or the external power source using the first relay or the second relay, respectively.

8. The battery rack of claim 7,
wherein each of the plurality of slave battery management systems comprises a voltage converter coupled between the corresponding one of the battery packs and the second relay, and
wherein the voltage converter is configured to convert a voltage received from the corresponding one of the plurality of battery packs to correspond to the operating power of the slave battery management system.

9. The battery rack of claim 1,
wherein the corresponding one of the battery packs comprises a plurality of battery cells, and
wherein each of the slave battery management systems is configured to receive one of a plurality of cell balancing signals from the master battery management system and to perform a cell balancing operation on the battery cells in response to the cell balancing signal.

* * * * *